United States Patent
Fritz et al.

(10) Patent No.: US 9,106,204 B2
(45) Date of Patent: Aug. 11, 2015

(54) FOUR LC ELEMENT BALUN

(71) Applicant: Avago Technologies General IP (Singapore) Pte. Ltd., Singapore (SG)

(72) Inventors: Martin Fritz, Munich Bavaria (DE); Martin Handtmann, Riemerling (DE); Paul Bradley, Los Altos, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 32 days.

(21) Appl. No.: 13/914,271

(22) Filed: Jun. 10, 2013

(65) Prior Publication Data

US 2014/0361834 A1 Dec. 11, 2014

(51) Int. Cl.
*H03F 3/04* (2006.01)
*H03H 7/42* (2006.01)
*H03F 3/26* (2006.01)
*H03F 3/195* (2006.01)

(52) U.S. Cl.
CPC ............ *H03H 7/42* (2013.01); *H03F 3/195* (2013.01); *H03F 3/26* (2013.01); *H03F 2200/06* (2013.01); *H03F 2200/294* (2013.01); *H03F 2200/372* (2013.01)

(58) Field of Classification Search
CPC .......... H03F 2200/451; H03F 3/45179; H03F 2200/294; H03F 3/19; H03F 3/193; H03F 3/195; H03F 3/21; H03F 1/0205; H03F 2200/06; H03F 2200/09; H03F 1/3205; H03F 1/523
USPC ............ 330/301; 333/24 R, 25, 26, 116, 117, 333/301
See application file for complete search history.

(56) References Cited

U.S. PATENT DOCUMENTS

| | | | |
|---|---|---|---|
| 5,574,411 A | 11/1996 | Apel et al. | |
| 6,052,039 A | 4/2000 | Chiou et al. | |
| 6,064,872 A * | 5/2000 | Vice | 333/119 |
| 6,621,370 B1 * | 9/2003 | Dao | 333/25 |
| 6,661,306 B2 | 12/2003 | Goyette et al. | |
| 6,803,835 B2 * | 10/2004 | Frank | 333/26 |
| 6,876,273 B2 * | 4/2005 | Harada et al. | 333/133 |
| 6,900,705 B2 * | 5/2005 | Nakamura et al. | 330/301 |
| 7,479,850 B2 | 1/2009 | Kearns et al. | |

OTHER PUBLICATIONS

Vinu Govind, "Design of Baluns and Low Noise Amplifiers in Integrated Mixed-Signal Organic Substrates" Georgia Institute of Technology, Aug. 2005, http://www.ece.gatech.edu/research/labs/hppdl/Epsilon2010/Members/Graduated_students/Vinu%20Govind/thesis/vinu_PhD.pdf>, pp. 1-169.

* cited by examiner

*Primary Examiner* — Khanh V Nguyen

(57) ABSTRACT

A balun includes an unbalanced port having a single-ended terminal, a balanced port having first and second differential terminals, and first and second series resonant LC circuits. The first series resonant LC circuit is connected between the first and second differential terminals, and includes a first element of a first type and one element of a second type connected in series. The second series resonant LC circuit is connected between the single-ended terminal and ground, and includes second and third elements of the first type and the one element of the second type connected in series. The one element of the second type is shared by the first and second series resonant LC circuits. The first differential terminal is connected between the one element of the second type and the third element of the first type.

23 Claims, 9 Drawing Sheets

FOUR LC ELEMENT BALUN

BACKGROUND

Portable communication devices, such as cellular telephones, personal digital assistants (PDAs), electrical gaming devices, laptop computers, and the like, are configured to communicate over wireless networks. Accordingly, each such portable communication device relies on a receiver and a transmitter, typically connected to a single or common antenna, for sending and receiving data and control signals over the wireless network. Of course, the receiver and transmitter may be incorporated into a transceiver, having a receiver portion and a transmitter portion. In order to use the common antenna, often a duplexer is included to interface between the antenna and each of the receiver portion and the transmitter portion, so that the receiver portion is able to receive signals on a receive (downlink) frequency, and the transmitter portion is able to send transmit signals on a different transmit (uplink) frequency. The receive and transmit signals may be radio frequency (RF) signals, for example.

Various types of wireless network are implemented according to different communication standards, such as universal mobile telecommunications system (UMTS), global system for mobile communication (GSM), personal communications services (PCS), digital cellular system (DCS), international mobile telecommunication (IMT), and enhanced data rates for GSM evolution (EDGE). The communication standards identify separate bands for transmitting and receiving signals. For example, band 1 provides an uplink frequency band of 1920 MHz-1980 MHz and a downlink frequency band of 2110 MHz-2170 MHz; UMTS band 2 (PCS) provides an uplink frequency band of 1850 MHz-1910 MHz and a downlink frequency band of 1930 MHz-1990 MHz; UMTS band 3 (DCS) provides an uplink frequency band of 1710 MHz-1785 MHz and a downlink frequency band of 1805 MHz-1880 MHz; UMTS band 7 (IMT-E) provides an uplink frequency band of 2500 MHz-2570 MHz and a downlink frequency band of 2620 MHz-2690 MHz; and UMTS band 8 (GMS-900) provides an uplink frequency band of 880 MHz-915 MHz and a downlink frequency band of 925 MHz-960 MHz. Accordingly, a duplexer operating in compliance with a UMTS standard would include a transmit filter having a passband within the corresponding uplink frequency band, and a receive filter having a passband within the corresponding downlink frequency band.

The duplexer includes two band-pass filters having different passbands, thus preventing or reducing interference between the receive and transmit signals. That is, the duplexer includes a receive filter having a receive passband for filtering the receive signals, and a transmit filter having a transmit passband for filtering the transmit signals. The band-pass receive and transmit filters may include acoustic resonator filter elements, such as surface acoustic wave (SAW) or bulk acoustic wave (BAW) resonators, such as thin film bulk acoustic resonators (FBARs) or solidly mounted resonators (SMRs), for example, for filtering the receive and transmit signals. Generally, impedance matching circuits are needed to enable the duplexer to interface with the receiver and transmitter portions of a transceiver, respectively.

FBAR filters usually have single-ended input and output terminals for single-ended (unbalanced) signals, while the receiver or transmitter portions of the transceiver with which the FBAR filters interface typically have differential input and output terminals. An FBAR filter therefore relies on a balancing device, such as a balun (in addition to the impedance matching circuit), for example, to convert between single-ended and differential signals in order to interface with the transmitter and receiver portions of the transceiver. This adds to the size, cost and insertion loss of the component.

A balun suitable for such applications and frequencies typically include inductor-capacitor (LC) circuits, which require a number of inductors and capacitors. Such a balun may be referred to as a "lumped element balun." The fewer inductors and capacitors included generally result in less space, and lower cost of the balun. Accordingly, design efforts have been made to achieve satisfactory balun functionality with the fewest possible LC elements, where LC element refers to a reactance (or susceptance) which is typically implemented as either an inductor or a capacitor. However, in general, conventional baluns require at least four LC elements, as found in a lattice-type balun, and typically more than four LC elements. Larger numbers of LC elements make implementation more difficult, typically lead to higher losses and require a larger area. Even in the lattice-type balun, the four LC elements must include two inductors and two capacitors. This may be problematic in technologies where one type of LC element cannot be implemented as easily or accurately as the other type of LC element, or is not conducive to space saving or high performance (e.g. high quality factor, less degradation by unwanted coupling effects, etc.) In addition, a lattice-type balun does not have a DC blocking capability between balanced and unbalanced ports. Accordingly, a lumped element balun is needed with no more than four LC elements, where at least three of the elements are either all capacitors or all inductors.

SUMMARY

In a representative embodiment, a balun includes an unbalanced port configured to apply a single-ended signal, a first capacitor connected between the unbalanced port and an internal node, an inductor connected between the internal node and a first differential terminal of a balanced port, a second capacitor connected between the first differential terminal and ground, and a third capacitor connected between the internal node and a second differential terminal of the balanced port.

In another representative embodiment, a balun includes an unbalanced port configured to apply a single-ended signal, a first inductor connected between the unbalanced port and an internal node, a capacitor connected between the internal node and a first differential terminal of a balanced port, a second inductor connected between the first differential terminal and ground, and a third inductor connected between the internal node and a second differential terminal of the balanced port.

In another representative embodiment, a four LC element balun includes an unbalanced port having a single-ended terminal referenced to ground and configured to apply a singled-ended signal, a balanced port having first and second differential terminals configured to apply a differential signal, a first series resonant LC circuit connected between the first and second differential terminals, and a second series resonant LC circuit connected between the single-ended terminal and ground. The first series resonant LC circuit includes a first element of a first type and one element of a second type connected in series. The second series resonant LC circuit includes second and third elements of the first type and the one element of the second type connected in series, the second element of the first type being connected between the single-ended terminal and the one element of the second type, and the third element of the first type being connected between the one element of the second type and ground. The one element of the second type is shared by the first and second series resonant LC circuits, and the first differential terminal is connected between the one element of the second type and the third element of the first type.

In another representative embodiment, a balun includes an unbalanced port configured to apply a single-ended signal, a first susceptance element connected between the unbalanced port and an internal node, the first susceptance element comprising a physically realizable LC element, a reactance element connected between the internal node and a first differential terminal of a balanced port, a second susceptance element connected between the first differential terminal and ground, and a third susceptance element connected between the internal node and a second differential terminal of the balanced port. The unbalanced port includes a single-ended terminal having a first complex port impedance, and the balanced port includes differential terminals each having a second complex port impedance.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
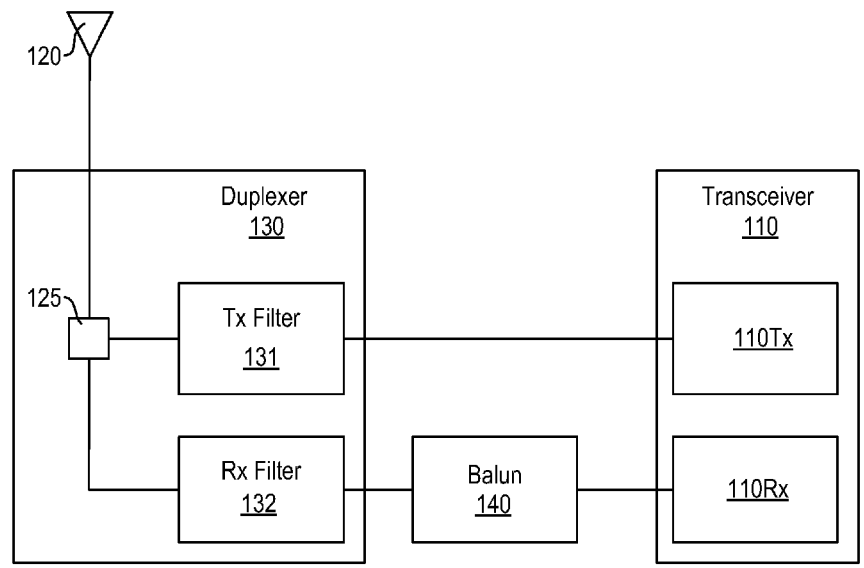
FIG. 1 is a block diagram of a transceiver circuit, including a duplexer and a transceiver.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is understood that the drawings and the various elements depicted therein are not drawn to scale. Further, relative terms, such as "above," "below," "top," "bottom," "upper" and "lower" are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be below that element.

Generally, according to various embodiments, a balun is provided that consists of four LC elements. In the following description, basic circuits and corresponding benefits are described with reference to baluns having pure real port impedances at the unbalanced and balanced ports, which this is the more common case in practical applications. However, it is understood that the circuits are not limited to pure real port impedances. Therefore, descriptions of baluns having arbitrary complex impedances at the unbalance and balanced ports are also provided, which maybe is useful for some applications. Dimensioning of the balun circuits may be accomplished using formulas for pure real port impedances, as well as complex port impedances, provided below. Further, an example of the balun circuit in a configuration allowing DC feeding is also provided, which may be used for applications such as push-pull amplifiers.

According to various embodiments, in the case of pure real port impedances, the balun includes a first series resonant LC circuit for providing a balanced port for a differential signal, which includes a first element of the first type and one element of the second type connected in series between differential terminals of the balanced port. The balun also includes a second series resonant LC circuit for providing an unbalanced port for a single-ended signal, which includes second and third elements of the first type and the one element of the second type connected in series between a single-ended terminal of the unbalanced port and ground. The second element of the first type may be connected between the single-ended terminal and the one element of the second type, the third element of the first type may be connected between the one element of the second type and ground, and one of the differential terminals may be between the third element of the first type and the one element of the second type. Notably, the one element of the second type is shared by the first and second series resonant LC circuits.

In comparison to the lattice-type balun mentioned above, the balun according to the various embodiments minimizes one type of LC element. This is beneficial where implementation of this type of LC element is difficult, takes up excessive space, and/or affects high performance. Notably, the lattice-type balun uses uncoupled low and high pass filter in principle, while the various embodiments discussed herein use two electrically coupled LC series resonance circuits.

FIG. 1 is a block diagram of a transceiver circuit, including a duplexer and a transceiver. Referring to FIG. 1, transceiver circuit 100 includes transceiver 110 connected to common antenna 120 through duplexer 130. The transceiver 110 includes transmitter portion 110Tx for sending transmit signals to the antenna 120 and receiver portion 110Rx for receiving receive signals from the antenna 120. The transmitter portion 110Tx is connected to a transmit filter 131 in the duplexer 130, and the receiver portion 110Rx is connected to a receive filter 132 in the duplexer 130, where the transmit and receive filters 131 and 132 may be FBAR filters or SMR BAW filters, for example. The transmit filter 131 and the receive filter 132 are connected to the common antenna 120 via an antenna impedance matching network 125 to ensure that the transmit filter 131 and the receive filter 132 do not act as mismatching networks between the common antenna 120 and the other filter. The antenna impedance matching network 125 may be a shunt inductor to ground or a transmission line connected between the receive filter 132 and a common connection point of antenna 120, transmission line and transmit filter 131, for example, although other implementations may be included.

As discussed above with regard to receiver and transmitter portions having differential input and output terminals, because the receiver portion 110Rx typically requires a differential input signal, the single-ended output signal provided by the receive filter 132 passes through balun 140, which is a matched balun that converts a single-ended signal into a differential signal, and which provides impedance matching with respect to the single-ended output terminal of the receive filter 132 and the differential input terminals of the receiver portion 110Rx.

Figure 2:
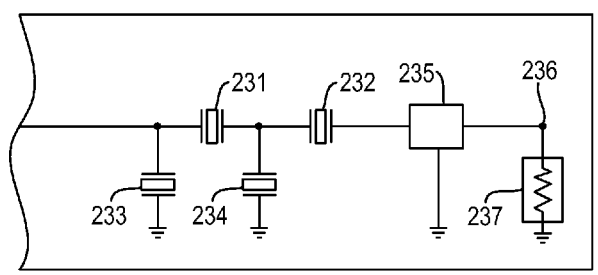
FIG. 2 is a simplified circuit diagram of a portion of a receive filter in the duplexer of FIG. 1.

FIG. 2 is a simplified circuit diagram of a portion of an illustrative receive filter 132 in the duplexer 130 of FIG. 1. In the depicted example, the receive filter 132 is an FBAR receive filter includes multiple FBARs, indicated for purposes of illustration as a ladder type filter with representative series FBARs 231 and 232 and representative shunt FBARs 233 and 234, which may also have inductors connected in series (not shown), respectively. Of course, other numbers and combinations of series and/or shunt FBARs may be included in the receive filter 132, and/or other types of filters or single-ended or differential electrical devices may be provided. The receive filter 132 further includes impedance matching circuit 235 connected in series between the last FBAR (FBAR 232) of the receive filter 132 and single-ended terminal 236. The impedance matching circuit 235 may include a series connected inductor, for example. The impedance of the single-ended terminal 236 related to reference ground (e.g., about 50 ohms) is indicated by representative impedance 237. Notably, indication of the impedance 237 would not be present when the receive filter 132 and the balun 140 are connected to one another.

Figure 3A:
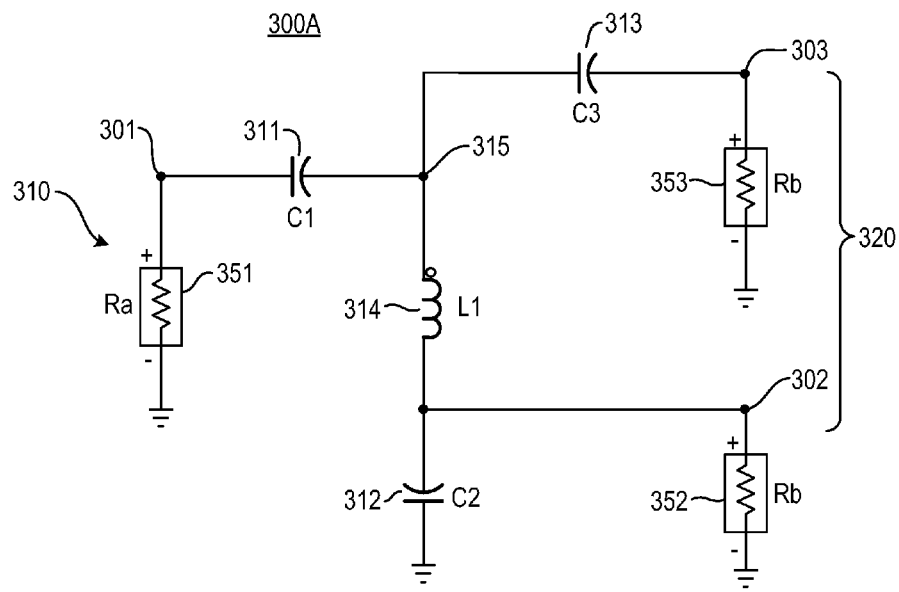
FIG. 3A is a simplified circuit diagram illustrating a four LC element balun, according to a representative embodiment.

FIG. 3A is a simplified circuit diagram illustrating a four LC element balun, according to a representative embodiment.

Referring to FIG. 3A, balun 300A includes unbalanced port 310 and balanced port 320, which are assumed to have pure real port impedances for ease of description. The more complicated situation in which unbalanced and balanced ports have complex impedances is discussed below with reference to FIG. 5. The unbalanced port 310 includes a single-ended terminal 301 referenced to ground, and has a reference impedance Ra (e.g., about 50 ohms), as indicated by resistor 351. The balanced port 320 includes first and second differential terminals 302 and 303, each of which has a reference impedance Rb when referenced to ground (e.g., about 50 ohms, or about 100 ohms differential), as indicated by resistors 352 and 353, respectively.

The balun 300A may also include an optional ground terminal (not shown) at the balanced port 320 for connection to reference ground. The ground terminal is needed to allow for unbalanced current flow when the balanced port 320 is attached to a not fully differential circuit or when the balanced port 320 is driven by not fully differential signals. In general, the optional ground terminal is not connected when the balanced port 320 is fully differentially driven. The ground terminal is also needed when a DC feed is required by an application, as discussed below with reference to FIG. 3B, for example.

In an illustrative configuration, the single-ended terminal 301 of the unbalanced port 310 may be connected to an unbalanced port of an electrical circuit, such as a filter circuit (e.g., FBAR receive filter 132 of the duplexer 130) or an antenna circuit (e.g., antenna 120 followed by a balanced filter circuit), for example, to receive a single-ended signal. The first and second differential terminals 302 and 303 of the balanced port may be connected to a balanced port of a transceiver (e.g., receiver portion 110Rx of transceiver 110) or a balanced filter circuit, for example, to output a differential signal. Also, a signal provided to the single-ended terminal 301 may be a radio frequency (RF) signal from the receive filter. However, the balun 300A is not limited to this application, and may be used to convert single-ended signals to differential signals and vice versa between various types of balanced and unbalanced electrical devices.

The balun 300A includes four LC elements, three of which are one type of LC element (capacitor) and only one of which is the other type of LC element (inductor). In particular, the balun 300A includes first capacitor 311, second capacitor 312, third capacitor 313 and inductor 314. Generally, "capacitor" is intended to cover any two port element having a capacitance value, and "inductor" is intended to cover any two port element having an inductance value. In the depicted embodiment, the first capacitor 311 is connected between the single-ended terminal 301 of the unbalanced port 310 and internal node 315, which is located between the inductor 314 and the third capacitor 313. The inductor 314 is connected between the internal node 315 and the first differential terminal 302 of the balanced port 320. The second capacitor 312 is connected between the first differential terminal 302 and ground. The third capacitor 313 is connected between the internal node 315 and the second differential terminal 303 of the balanced port 320. Generally, capacitors acts as DC-block, and therefore no additional blocking capacitors are required in the balun 300A. In various embodiments, one or more of the first through third capacitors 311-313 may be implemented within the balanced and/or unbalanced circuit (e.g., receive filter 132) to which it is connected. For example, the first capacitor 311, in particular, may be implemented as a series resonator of the receive filter 132, e.g., realized as an FBAR with a resonance frequency apart from the filter passband, such that the behavior of the resonator in the passband is dominantly capacitive. Likewise, in various embodiments, the inductor 314 may be implemented within the balanced and/or unbalanced circuit to which the balun 300A is connected.

In the depicted embodiment, the inductor 314 and the third capacitor 313 form a first resonant series LC circuit, which applies a differential signal at the first and second differential terminals 302 and 303 of the balanced port 320. The first capacitor 311, the inductor 314 and the second capacitor 312 form a second resonant series LC circuit to ground, which applies a single-ended signal at the single-ended terminal 301 of the unbalanced port 310. Both the first and second resonant series LC circuits are coupled by the common inductor 314.

For purposes of discussion, the first capacitor 311 has a first capacitance value C1, the second capacitor 312 has a second capacitance value C2 and the third capacitor 313 has a third capacitance value C3. In an embodiment, the first capacitance value C1 of the first capacitor 311 is substantially equal to the second capacitance value C2 of the second capacitor 312, and the second capacitance value C2 is substantially equal to two times the third capacitance value C3 of the third capacitor 313. Throughout this disclosure, the term "substantially" is used to indicate that actual values and relationships may differ slightly from calculated ideal values and relationships to account for deviations in physical realizations, e.g., caused by parasitic effects and the like, as would be apparent to one of ordinary skill in the art.

The third capacitance value C3 is substantially determined according to Equation (1), in which ω is equal to 2πf, f is the target design frequency of the balun 300A which depends on the operation frequency of the application and therefore the frequency of the applied signals. That is, target design frequency is one frequency for which the balun 300A is designed, while operation frequency is the frequency range where the balun 300A is applicable. Since target design frequency is one frequency, the operation frequency is commonly a frequency band, such as the example frequency bands mentioned above. Further, with respect to Equation (1), Ra is impedance of the single-ended terminal 301 referenced to ground and Rb is impedance of each of the first and second differential terminals 302 and 303 each referenced to ground.

$$C3 = \sqrt{\frac{1}{2\omega^2 \times Ra \times Rb}} \qquad (1)$$

For example, each of the impedance Ra and the impedance Rb may be about 50 ohms, although the impedance values may vary to provide unique benefits for any particular situation or to meet application specific design requirements of various implementations.

The inductor 314 has an inductance value L1, which may be substantially determined according to Equation (2).

$$L1 = \frac{1}{\omega^2 \times C3} \qquad (2)$$

Some semiconductor technologies, including thin film technologies, allow realization of small sized capacitors. For example, technologies such as complementary metal-oxide-semiconductor (CMOS) (gate capacitance) and FBAR (e.g. to implement resonators), capacitors are generally easier and more stable to implement than inductors, and typically exhibit better performance (e.g., higher quality factor Q) within a smaller area. Therefore generally, use of three capacitors (first through third capacitors 311-313) and only one inductor (inductor 314) reduces the amount of physical space needed for implementation of the balun 300A, in such technologies. Further, due to the higher quality factor Q of capacitors, the insertion loss of balun 300A is reduced.

Each of the first through third capacitors 311-313 and the inductor 314 respectively has a positive capacitive or inductance value, and consequently is physically realizable. Therefore, a stand-alone implementation of the balun 300A is possible, where the balun 300A may be connected between any (impedance matched) unbalanced input/output and balanced output/input. There are no limiting requirements regarding other parts or components to which the balun 300A is connected or as to the application itself. Further, the balun 300A is a matched balun, in that it provides impedance matching as well as mode conversion between unbalanced signals at the unbalanced port 310 and balanced signals at the balanced port 320. For example, impedance of the single-ended terminal 301 referenced to ground may match impedance of the single-ended terminal (e.g., single-ended terminal 236) of a filter or other single-ended electrical device, and differential impedance between first and second differential terminals 302 and 303 may match impedance of differential input terminals of a receiver portion (e.g., receiver portion 110Rx) of a transceiver or other differential electrical device.

With respect to balanced to unbalanced transformations, the balun 300A allows any arbitrary pure real port impedance transformation between the unbalanced port 310 and the balanced port 320 by appropriate dimensioning, e.g., using simple mathematics equations, as would be apparent to one of ordinary skill in the art. Therefore, an additional impedance transformer network, for example, is not needed when using the balun 300A, which saves circuit implementation area (e.g., IC die area) and generally improves overall losses for applications that also require impedance transformation.

In various embodiments, since the balun 300A requires only one inductor, it is possible to fit the FBAR filter and balun into a smaller package. This is particularly true when some or all of the first through third capacitors 311-313 are fabricated in the FBAR filter die. This results in size and cost reduction and improves the insertion loss. For example, a duplexer that includes the balun 300A may be fit into a 2.0 mm×1.6 mm form factor, which is the next generation of size reduction required for handset duplexers.

Figure 3B:
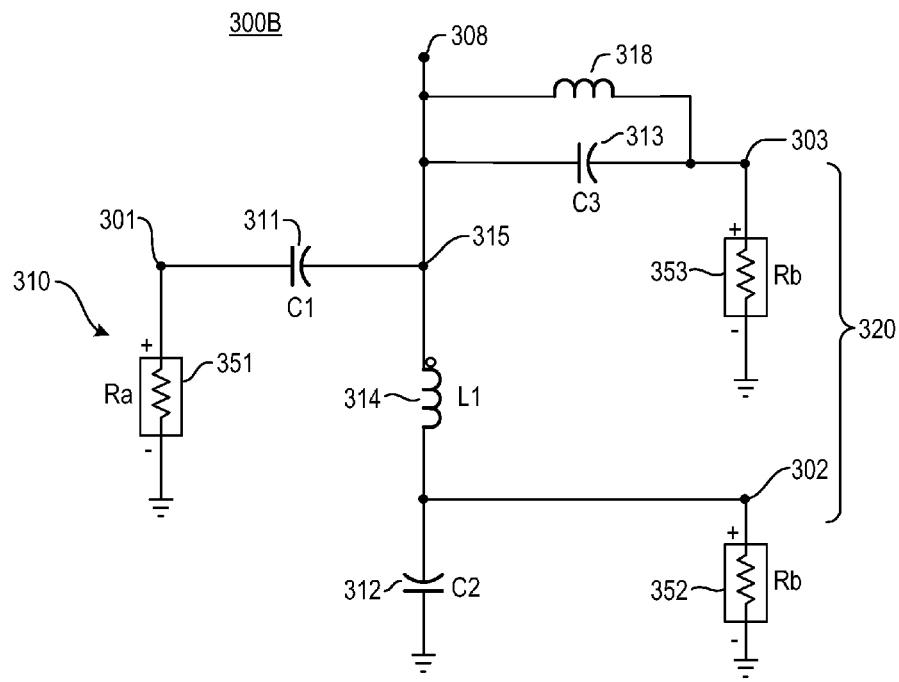
FIG. 3B is a simplified circuit diagram illustrating a four LC element balun, according to a representative embodiment.

FIG. 3B is a simplified circuit diagram illustrating a four LC element balun, according to a representative embodiment.

Referring to FIG. 3B, balun 300B is similar to balun 300A, except that it is configured for a DC feed, e.g., required by an application. That is, in addition to the first capacitor 311, the second capacitor 312, the third capacitor 313 and the inductor 314 (the RF-part), the balun 300B includes bypass inductor 318 connected in parallel with the third capacitor 313 between the internal node 315 and the second differential terminal 303. The bypass inductor 318 enables DC feeding via DC feed contact 308, which is also connected to the internal node 315. Generally, the bypass inductor 318 effectively provides a short circuit for DC signals and an open circuit for AC signals. The bypass inductor 318 may be implemented within the balun circuit, for example, on the same substrate or as an external component. In alternative configurations, the DC feed contact 308 may coincide with the first differential terminal 302 or the second differential terminal 303. In addition, a feeding inductor (not shown) may be added to decouple RF and DC parts from one another such that the balun circuit is not loaded by the DC source at the balun operation frequency range, and blocking capacitors (not shown) may be added to suppress oscillations coming from the DC path at the DC feed contact 308.

Figure 4A:
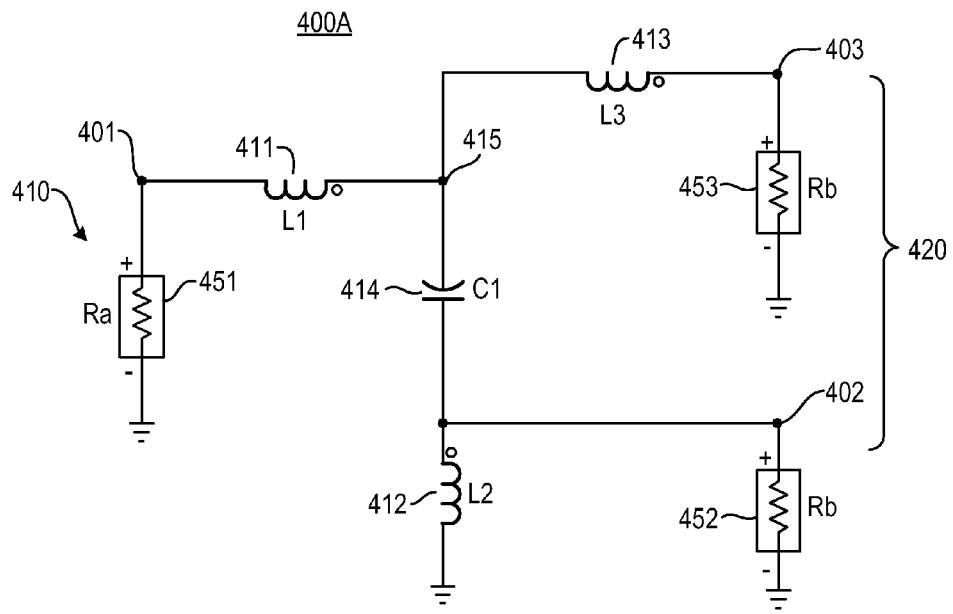
FIG. 4A is a simplified circuit diagram illustrating a four LC element balun, according to another representative embodiment.

FIG. 4A is a simplified circuit diagram illustrating a four LC element balun, according to another representative embodiment.

Referring to FIG. 4A, balun 400A includes unbalanced port 410 and balanced port 420, which are assumed to have pure real port impedances for ease of description. The unbalanced port 410 includes a single-ended terminal 401 referenced to ground, and has a reference impedance Ra (e.g., about 50 ohms), as indicated by resistor 451. The balanced port 420 includes first and second differential terminals 402 and 403, each of which has a reference impedance Rb when referenced to ground (e.g., about 50 ohms, or about 100 ohms differential), as indicated by resistors 452 and 453, respectively. The balun 400A may also include an optional ground terminal (not shown) at the balanced port 420 for connection to reference ground. The ground terminal is needed to allow for unbalanced current flow when the balanced port 420 is attached to a not fully differential circuit or when the balanced port 420 is driven by not fully differential signals. In general, the optional ground terminal is not connected when the balanced port 420 is fully differentially driven. The ground terminal is also needed when a DC feed is required by an application, as discussed below with reference to FIG. 4B, for example.

In an illustrative configuration, the single-ended terminal 401 of the unbalanced port 410 may be connected to an unbalanced port of an electrical circuit, such as a filter circuit (e.g., FBAR receive filter 132 of the duplexer 130) or an antenna circuit (e.g., antenna 120 followed by a balanced filter circuit), for example, to receive a single-ended signal. The first and second differential terminals 402 and 403 of the balanced port 420 may be connected to a balanced port of a transceiver (e.g., receiver portion 110Rx of transceiver 110) or a balanced filter circuit, for example, to output a differential signal. Also, a signal provided to the single-ended terminal 401 may be an RF signal from the receive filter. However, the balun 400A is not limited to this application, and may be used to convert single-ended signals to differential signals and vice versa between various types of unbalanced and balanced electrical devices.

Like the balun 300A, the balun 400A includes only four LC elements, three of which are one type of LC element and only one of which is the other type of LC element. However, in the balun 400A, there are three inductors and only one capacitor. In particular, the balun 400A includes first inductor 411, second inductor 412, third inductor 413 and capacitor 414. The balun 400A may be beneficial for technologies in which inductors can be more favorably implemented than capacitors, or may be a desirable alternative for a stand-alone implementation, e.g., using surface mounted device (SMD) components.

In the depicted embodiment, the first inductor 411 is connected between the single-ended terminal 401 of the unbalanced port 410 and internal node 415, which is located between the capacitor 414 and the third inductor 413. The capacitor 414 is connected between the internal node 415 and the first differential terminal 402 of the balanced port 420. The second inductor 412 is connected between the first differential terminal 402 and ground. The third inductor 413 is connected between the internal node 415 and the second differential terminal 403 of the balanced port 420. In various embodiments, one or more of the first through third inductors 411-413 may be implemented within the balanced and/or unbalanced circuit (e.g., receive filter 132) to which it is connected. For example, the first inductor 411, in particular, may be seen as a wirebond of the receive filter 132. Likewise, in various embodiments, the capacitor 414 may be implemented within the balanced or unbalanced circuit to which the balun 400A is connected.

In the depicted embodiment, the capacitor 414 and the third inductor 413 form a first resonant series LC circuit, which applies a differential signal at the first and second differential terminals 402 and 403 of the balanced port 420. The first inductor 411, the capacitor 414 and the second inductor 412 form a second resonant series LC circuit to ground, which applies a single-ended signal at the single-ended terminal 401 of the unbalanced port 410. Both the first and second resonant series LC circuits are coupled by the common capacitor 414.

For purposes of discussion, the first inductor 411 has a first inductance value L1, the second inductor 412 has a second inductance value L2, the third inductor 413 has a third inductance value L3, and the capacitor 414 has a capacitance value C1. In an embodiment, the first inductance value L1 of the first inductor 411 is substantially equal to the second inductance value L2 of the second inductor 412. The second inductance value L2 is substantially determined according to Equation (3), in which $\omega$ is equal to $2\pi f$, where f is the target design frequency of the balun 400A, which is dependent on the operation frequency of the application and therefore dependent on the frequency of the applied signals, as discussed above.

$$L2 = \frac{1}{2\omega^2 \times C1} \quad (3)$$

The third inductance value L3 is substantially determined according to Equation (4), in which Ra is impedance of the single-ended terminal 401 referenced to ground and Rb is impedance of each of the first and second differential terminals 402 and 403 each referenced to ground.

$$L3 = \sqrt{\frac{2 \times Ra \times Rb}{\omega^2}} \quad (4)$$

The capacitance value C1 of the capacitor 414 may be substantially determined according to Equation (5).

$$C1 = \frac{1}{\omega^2 \times L3} \quad (5)$$

Generally, use of three inductors (first through third inductors 411-413) and one capacitor (capacitor 414) reduces the amount of physical space in modules which use wirebond techniques, for example, since the inductance of the wirebonds can be used to realize at least a part of one or more of the needed inductance values. Furthermore, an implementation using SMDs may be more robust and reproducible since series inductors are less sensitive to parasitics (e.g., due to solder pads) than series capacitors, and are easier to compensate through slight adjustments to corresponding values. Also, the use of three inductors (first through third inductors 411-413) and one capacitor (capacitor 414) advantageous for microwave applications (e.g., radar), for example, because inductors are generally easier to implement than capacitors in this frequency range.

Each of the first through third inductors 411-413 and the capacitor 414 has a positive value, and consequently is physically realizable. Therefore, a stand-alone implementation of the balun 400A is possible, where the balun 400A may be connected between any (impedance matched) unbalanced input/output and balanced output/input. There are no limiting requirements regarding other parts or components to which the balun 400A is connected or as to the application itself. Further, the balun 400A is a matched balun, in that it provides impedance matching as well as mode conversion between unbalanced signals at unbalanced port 410 and balanced signals at balanced port 420. For example, impedance of the single-ended terminal 401 referenced to ground may match impedance of the single-ended terminal (e.g., single-ended terminal 236) of a filter, and differential impedance between first and second differential terminals 402 and 403 may match impedance of the differential terminals of a receiver portion (e.g., receiver portion 110Rx) of a transceiver.

With respect to balanced to unbalanced transformations, the balun 400A allows any arbitrary pure real port impedance transformation between the unbalanced port 410 and the unbalanced port 420 by appropriate dimensioning, e.g., using simple mathematics equations, as would be apparent to one of ordinary skill in the art. Therefore, an additional impedance transformer network, for example, is not needed when using the balun 400A, which saves circuit implementation area (e.g., IC die area or PCB area) and generally improves overall losses for applications that also require impedance transformation.

Figure 4B:
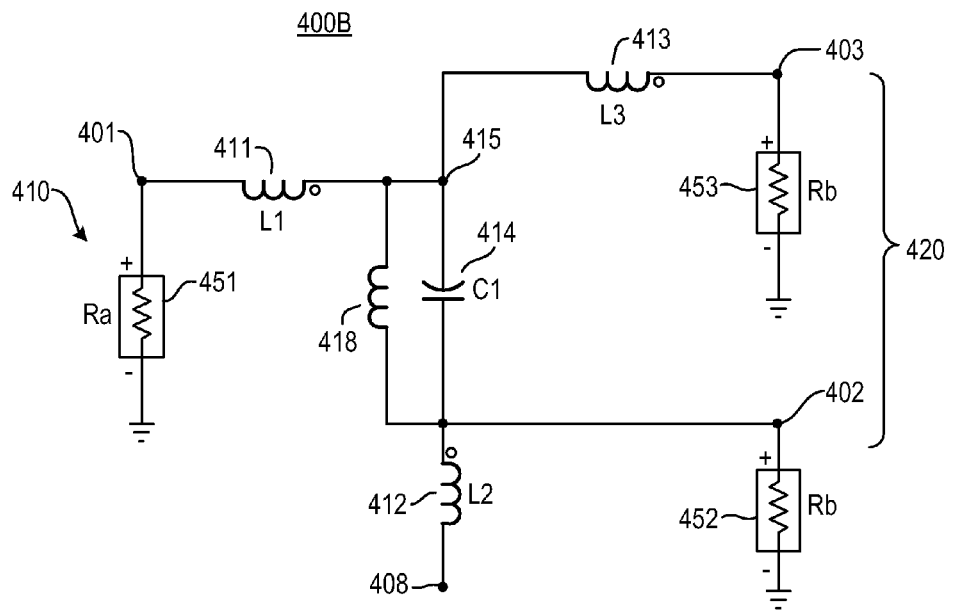
FIG. 4B is a simplified circuit diagram illustrating a four LC element balun, according to a representative embodiment.

FIG. 4B is a simplified circuit diagram illustrating a four LC element balun, according to a representative embodiment.

Referring to FIG. 4B, balun 400B is similar to balun 400A, except that it is configured for a DC feed, e.g., as required by an application. That is, in addition to the first inductor 411, the second inductor 412, the third inductor 413 and the capacitor 414 (the RF-part), the balun 400B includes bypass inductor 418 connected in parallel with capacitor 414 between the internal node 415 and the first differential terminal 402. The bypass inductor 418 enables DC feeding via DC feed contact 408, which is connected to the second inductor 412. The bypass inductor 418 may be implemented within the balun circuit, for example, on the same substrate or as an external component. In alternative configurations, the DC feed contact may coincide with the internal node 415, the first differential terminal 402 or the second differential terminal 403, in which cases the second inductor 412 is further connected via an additional DC blocking capacitor (not shown here) in series to node 408, which is connected to RF ground. In addition, a feeding inductor (not shown) may be added to decouple RF and DC parts from one another so that the balun 400B is not loaded by the DC source at the balun operation frequency range, and blocking capacitors (not shown) may be added to suppress oscillations coming from the DC path at the DC feed contact 408.

Figure 5:
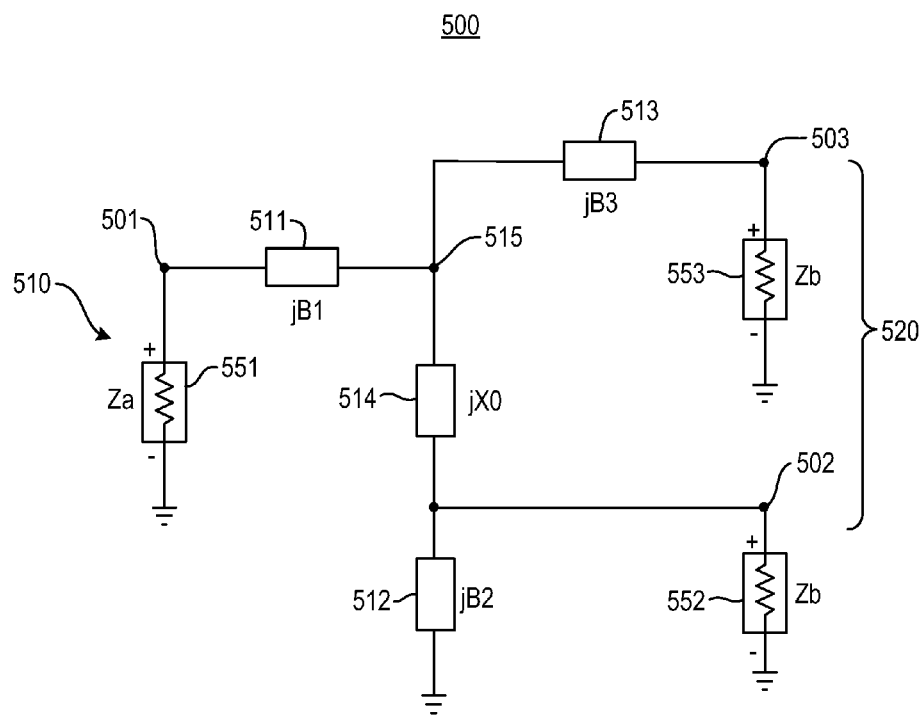
FIG. 5 is a simplified circuit diagram illustrating a four LC element balun with complex port impedances, according to a representative embodiment.

FIG. 5 is a simplified circuit diagram illustrating a four LC element balun, generalized to include arbitrary complex port impedances, according to representative embodiments. Notably, FIG. 5 uses reactances X and susceptances B as elements in place of capacitors and/or inductors. In order to provide for complex port impedances, reference impedance Za may be Ra+Xa*j, and Zb may be Rb+Xb*j, where Ra and Rb are resistances, Xa and Xb are reactances, and j is the imaginary operator.

Referring to FIG. 5, balun 500 includes unbalanced port 510 and balanced port 520, which may have complex port impedances. The unbalanced port 510 includes a single-ended terminal 501 referenced to ground, and has reference impedance Za, as indicated by impedance 551. The balanced port 520 includes first and second differential terminals 502 and 503, each of which has reference impedance Zb when referenced to ground, as indicated by impedances 552 and 553, respectively.

The balun 500 includes four LC elements, indicated as reactances X and susceptances B, as mentioned above. In particular, the balun 500 includes first susceptance element 511, second susceptance element 512, third susceptance element 513, and reactance element 514. In the depicted embodiment, the first susceptance element 511 is connected between the single-ended terminal 501 of the unbalanced port 510 and internal node 515, which is located between the reactance element 514 and the third susceptance element 513. The reactance element 514 is connected between the internal node 515 and the first differential terminal 502 of the balanced port 520. The second susceptance element 512 is connected between the first differential terminal 502 and ground. The third susceptance element 513 is connected between the internal node 515 and the second differential terminal 503 of the balanced port 520. In various embodiments, one or more of the first through third susceptance elements 511-513 and the reactance element 514 may be implemented within the balanced and/or unbalanced circuit (e.g., receive filter 132) to which it is connected.

For purposes of discussion, the first susceptance element 511 has a first susceptance value B1, the second susceptance element 512 has a second susceptance value B2 and the third susceptance element 513 has a third susceptance value B3. The reactance element has a reactance value X0. The first through third susceptance values B1 to B3 and the reactance value X0 are convertible into capacitance and/or inductance values by well known mathematic equations, as would be apparent to one of ordinary skill in the art. According to various embodiments, each susceptance and reactance is a physically realizable LC element, i.e., inductor or capacitor, with a positive value. As mentioned above, capacitors and inductors are physically implementable only when they have positive values, which is required in particular for implementation as a stand alone circuit. Accordingly, susceptances with positive values and reactances with negative values are typically realized as capacitors, while reactances with positive values and susceptances with negative values are typically realized as inductors. Further, the circuit depicted in FIG. 5 and relationships discussed below will provide the above mentioned baluns 300A and 400A and corresponding Equations (1) to (5), respectively, by using pure real impedances.

In the depicted embodiment, the reactance value X0 is substantially equal to the reciprocal of the third susceptance value B3, and the second susceptance value B2 is substantially equal to twice the third susceptance value B3. The third susceptance value B3 is substantially determined according to Equation (6), in which Yb is equal to the reciprocal of the reference impedance Zb and "Re" refers to the real part of the identified variable. Also, the positive/negative sign (+/−) in Equation (6) indicates two circuits, where the negative sign used in place of the positive sign provides the corresponding complementary circuit.

$$B3 = \pm \sqrt{\frac{\text{Re}\{Yb\}}{2 \times \text{Re}\{Za\}}} \quad (6)$$

The first susceptance value B1 (by definition) is equal to the negative of the reciprocal of first reactance value X1 (not shown in FIG. 5). The first reactance value X1 is substantially determined according to Equation (7), in which "Im" refers to the imaginary part of the identified variable.

$$X1 = -\frac{1}{B2} - \frac{\text{Im}\{Yb\}}{B2 \times B3} - \text{Im}\{Za\} \quad (7)$$

As mentioned above, the circuit depicted in FIG. 5 and the identified relationships, including Equations (6) and (7), may be used to provide the balun 300A and its complementary circuit balun 400A. For example, when reference impedances Za=Zb=50 Ohms and Equation (6) is used with a positive sign, the reactance value X0 is about 70.7 Ohms and the first susceptance value B1 is about 28 mS, the second susceptance value B2 is about 28 mS, and the third susceptance value B3 is about 14 mS. Using well known formulas, the reactance value X0 is convertible into an inductance value L1 of about 5.26 nH, the first susceptance value B1 is convertible into first capacitance value C1 of about 2.10 pF, the second susceptance value B2 is convertible into second capacitance value C2 of about 2.10 pF, and the third susceptance value B3 is convertible into third capacitance value C3 of about 1.05 pF. The corresponding equivalent complementary circuit is achieved by using Equation (6) with a negative sign. Again, when reference impedances Za=Zb=50 Ohms, the reactance value X0 is about −70.7 Ohms, the susceptance value B1 is about −28 mS, the susceptance value B2 is about −28 mS and susceptance value B3 is about −14 mS. The reactance value X0 is convertible into an capacitance value C1 of about 1.05 pF, the first susceptance value B1 is convertible into first inductance value L1 of about 2.7 nH the second susceptance value B2 is convertible into second inductance value L2 of about 2.7 nH, and the third susceptance value B3 is convertible into third inductance value L3 of about 5.26 nH.

FIGS. 6A to 6G are graphs depicting various simulated performance parameters of the four LC element balun, according to a representative embodiment. In the simulation, the balun 300A received an unbalanced signal in band 1 having a 2.140 GHz target frequency. The balun 300A was configured as described above, including Equations (1) and (2), where Ra and Rb were assumed as 50 ohms, so that the first capacitance value C1 was equal to about 2.10 pF, the second capacitance value C2 was equal to about 2.10 pF, the third capacitance value C3 was equal to about 1.05 pF, and the inductance value L1 was equal to about 5.26 nH. In the description below, S-parameters are used to indicate power of signals traveling between any two ports of the balun 300A, as is know in the art, where the single-ended terminal is port "1," the first differential terminal 302 is port "2" and the second differential terminal 303 is port "3," and each of the ports is referenced to ground for purposes of discussion.

Figure 6A:
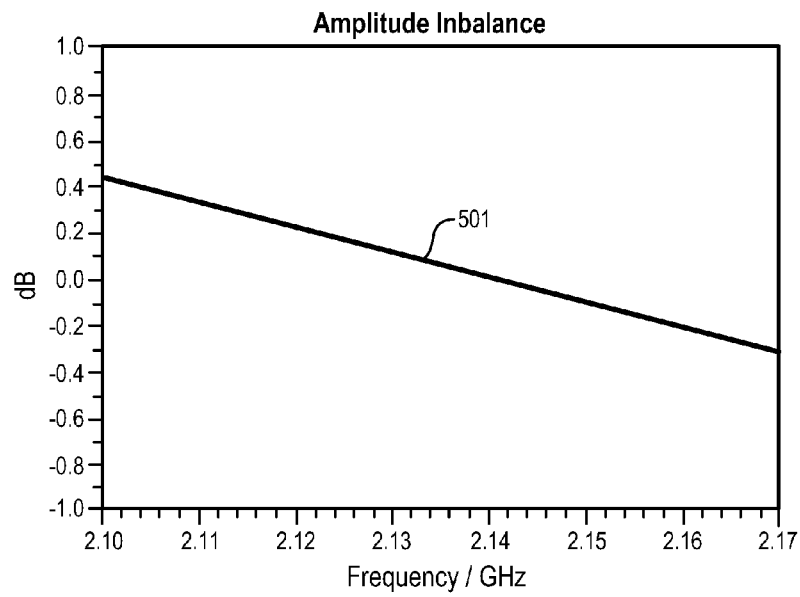
FIGS. 6A to 6G are graphs depicting various simulated performance parameters of the balun, according to a representative embodiment.

Trace 501 in FIG. 6A depicts amplitude imbalance between the first and second differential terminals 302 and 303, where the single-ended terminal 301 and the first and second differential terminals 302 and 303 are referenced to ground. The horizontal axis provides frequencies of the received signal in GHz, and the vertical axis provides the differences in magnitudes expressed in decibels (dB). In particular, amplitude imbalance is the difference in magnitude between a first signal path from the single-ended terminal 301 to the first differential terminal 302 and a second signal path from the single-ended terminal 301 to the second differential terminal 303 ($dB(S_{12})-dB(S_{13})$). For ideal baluns, the amplitude imbalance is zero dB, which is met by the balun 300A at the design target frequency of 2.140 GHz. This indicates that the differential output signal provided by the balun 300A is substantially balanced across the first and second differential terminals 302 and 303 in amplitude.

Figure 6B:
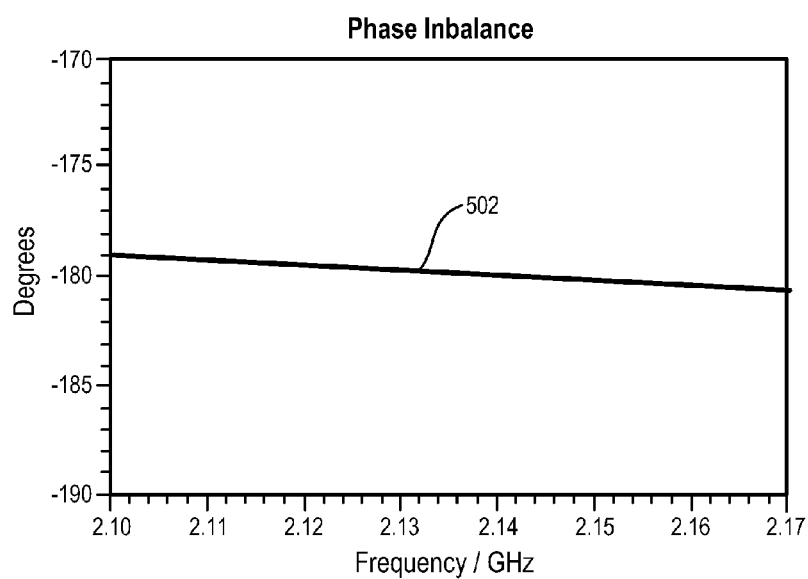

Trace 502 in FIG. 6B depicts phase imbalance between the first and second differential terminals 302 and 303, where the single-ended terminal 301 and the first and second differential terminals 302 and 303 are referenced to ground. The horizontal axis provides frequencies of the received signal in GHz, and the vertical axis provides the differences in phase in degrees. In particular, phase imbalance is the difference in phase shifts between the first signal path from the single-ended terminal 301 to the first differential terminal 302 and the second signal path from the single-ended terminal 301 to the second differential terminal 303 (phase($S_{12}$)−phase($S_{13}$)). For ideal baluns, the phase imbalance is +/−180 degrees, which is met by the balun 300A at the design target frequency of 2.140 GHz. This indicates that the signals forming the differential output signal provided by the balun 300A are substantially 180 degrees out of phase.

Figure 6C:
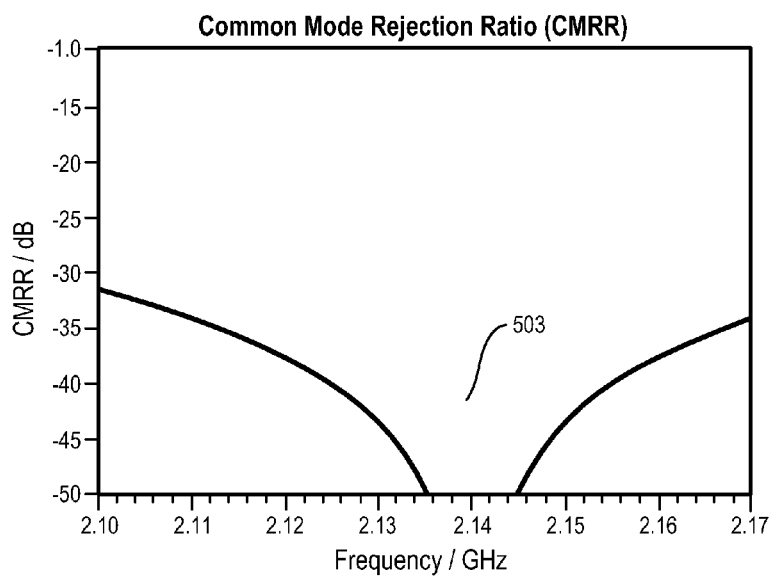

Trace 503 in FIG. 6C depicts the common mode rejection ratio (CMRR). CMRR is the tendency of a balun to reject the transmission of signals applied to the unbalanced port into a common mode signal at the balanced port. The unbalanced port is formed by single-ended terminal 301 referenced to ground, while the balanced port is formed by the first and second differential terminals 302 and 303. The lower the CMRR value expressed in dB, the better the balun performance. CMRR values of about −15 dB are excellent for non-ideal, practical balun circuits. In FIG. 6C, the horizontal axis provides frequencies of the received signal in GHz, and the vertical axis provides the ratio expressed in dB of the sum of the magnitudes of the first and second signal paths and the difference between the magnitudes of the first and the second signal paths ($dB(|S_{13}+S_{12}|/|S_{13}-S_{12}|)$), where the single-ended terminal 301 and the first and second differential terminals 302 and 303 are referenced to ground and where the first signal path is from the single-ended terminal 301 to the first differential terminal 302 and the second signal path is from the single-ended terminal 301 to the second differential terminal 302. As shown in FIG. 6C, the CMRR approaches infinity in an idealized simulation at the design target frequency of 2.140 GHz, which indicates that a common mode signal applied to the differential port 320 is suppressed completely and is consequently not transmittable to the unbalanced port 310.

Figure 6D:
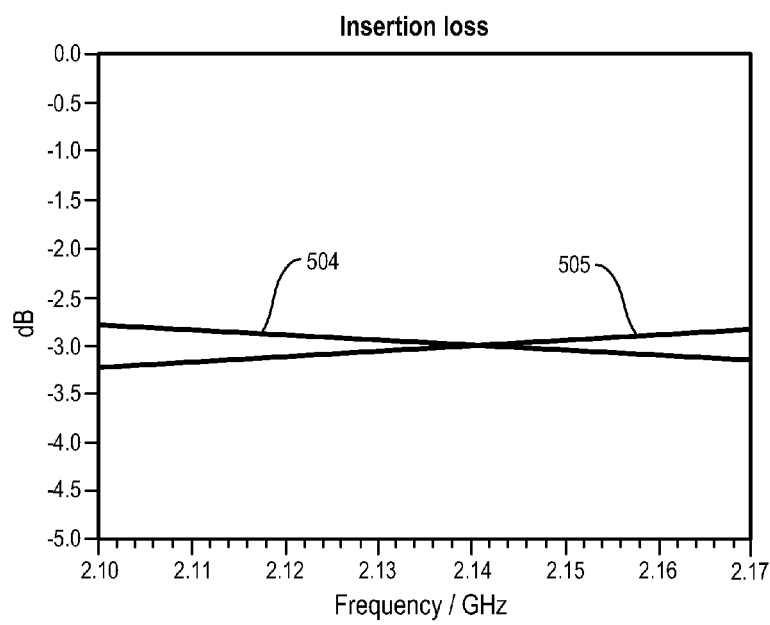

Traces 504 and 505 in FIG. 6D depict the insertion loss in dB of the balun 300A, where the single-ended terminal 301 and the first and second differential terminals 302 and 303 are referenced to ground. Insertion loss is the loss of power in a signal path. In FIG. 6D, trace 504 depicts the insertion loss of the first signal path from the single-ended terminal 301 to the first differential terminal 302 ($dB(S_{12})$), and trace 505 depicts the insertion loss of the second signal path from the single-ended terminal 301 to the second differential terminal 303 ($dB(S_{13})$). For ideal, lossless baluns, the insertion loss of each signal path is −3 dB, which is met by the balun 300A at the design target frequency of 2.140 GHz.

Figure 6E:
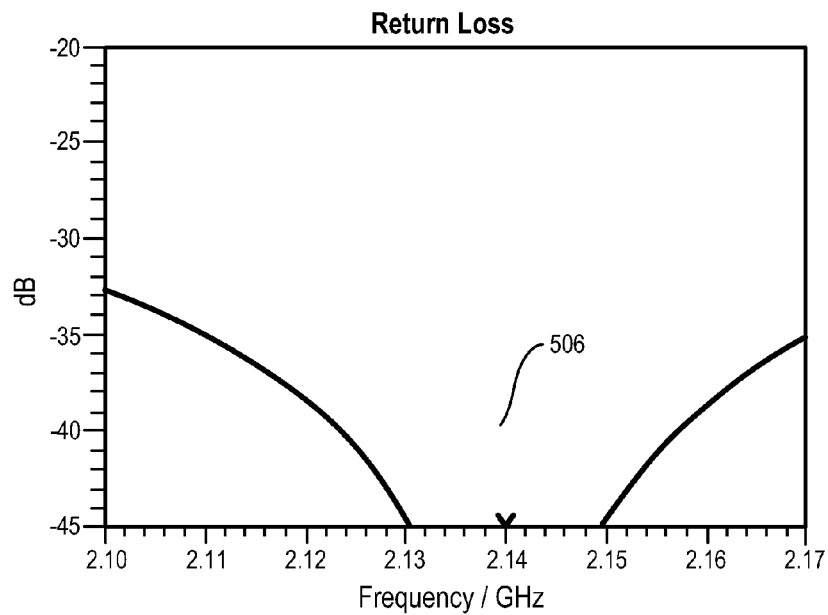

Trace 506 in FIG. 6E depicts the return loss in dB of the balun 300A, where the single-ended terminal 301 and the first and second differential terminals 302 and 303 are referenced to ground. Return loss is here defined as the ratio of reflected power to incident power expressed in dB. Trace 506 in particular, depicts the return loss at the single-ended terminal 301 ($dB(S_{11})$). The lower the return loss value expressed in dB, the better the performance of the balun 300A. For unbalanced port (unbalanced port 310), values of about −12 dB are typically required.

Figure 6F:
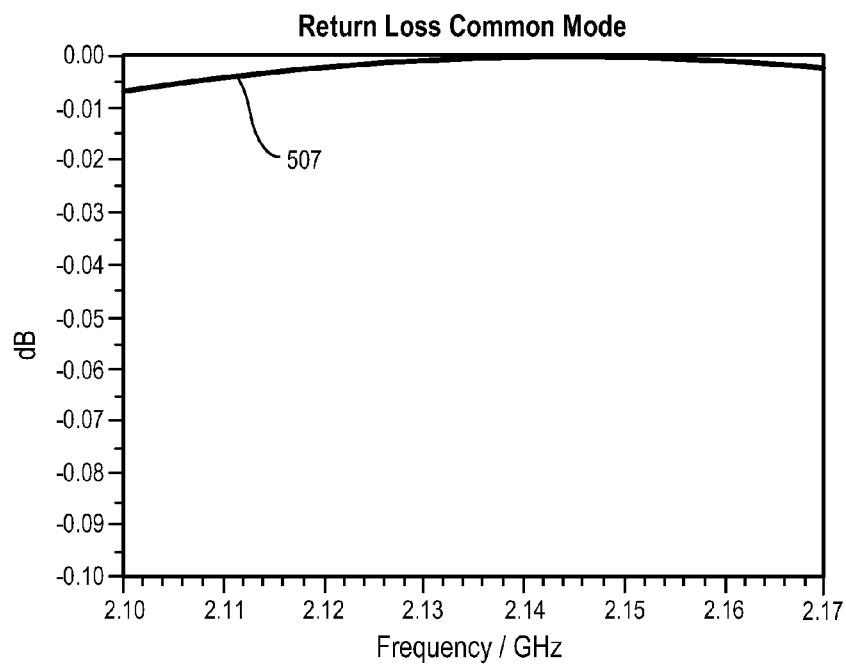
Figure 6G:
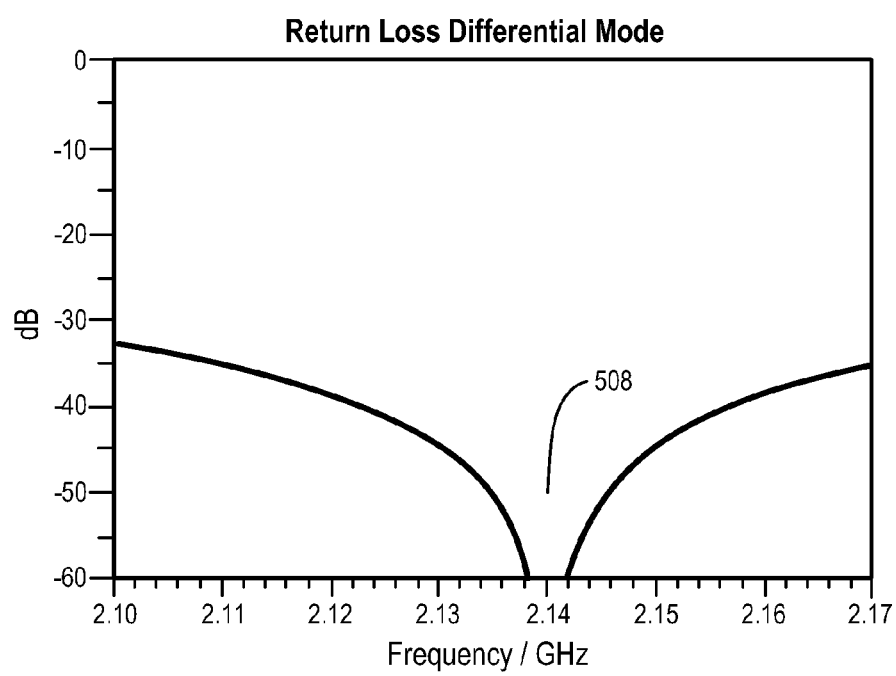

Trace 507 in FIG. 6F depicts the common mode return loss in dB of the balun 300A, and trace 508 in FIG. 6G depicts the differential mode return loss in dB of the balun 300A, where the single-ended terminal 301 and the first and second differential terminals 302 and 303 are referenced to ground. Return loss in dB of the balanced port 320 for the common mode is determined as $dB(0.5*(S_{33}+S_{22})+0.5*(S_{32}+S_{23}))$. For a common mode signal applied to the balanced port 320, a value close to zero is required, which is met by the balun 300A at the design target frequency of 2.140 GHz. In addition, return loss in dB of the balanced port 320 for the differential mode is determined as $dB(0.5*(S_{33}+S_{22})-0.5*(S_{32}+S_{23}))$. For practical balun circuits, about −12 dB is typically required for a differential mode signal applied to the balanced port 320, which is met by the balun 300A at the design target frequency of 2.140 GHz. Generally, regarding the return loss of the differential mode at the balanced port 320, the lower the return loss value expressed in dB is, the better the performance of the balun 300A. Trace 508 in FIG. 6G shows that the return loss approaches infinity in an idealized simulation at the design target frequency.

As mentioned above, the baluns according to various embodiments may be implemented with any of a variety of RF circuits, without departing from the scope of the present teachings. For example, the baluns may be configured to convert single-ended signals from a filter, including point filters and filters in multiplexer circuits, such as duplexers, triplexers, quadplexers, quintplexers, and the like. The RF circuits in which the baluns are implemented may also include amplifier circuits, such as push-pull amplifiers, discussed below with reference to FIG. 7. Further, as mentioned above, the baluns according to various embodiments are able to convert modes in both directions, unbalanced to balanced signals as well as balanced to unbalanced signals.

Also as mentioned above, the baluns according to various embodiments may be implemented as stand-alone devices (e.g., using SMD components), or may be integrated with the RF circuits. The RF circuits may consist of one die or multiple several dies, a lid and/or single or multiple layer substrates, for example. In various implementations, the dies of the RF circuit may include filter dies (e.g., including multiple acoustic resonators) and/or amplifier dies (e.g., including multiple transistors). In an integrated configuration with the RF circuit, the balun may be implemented in a die, in a lid, in a single or multiple layer substrate, on top of a substrate (e.g. using SMDs), or various combinations thereof.

Figure 7:
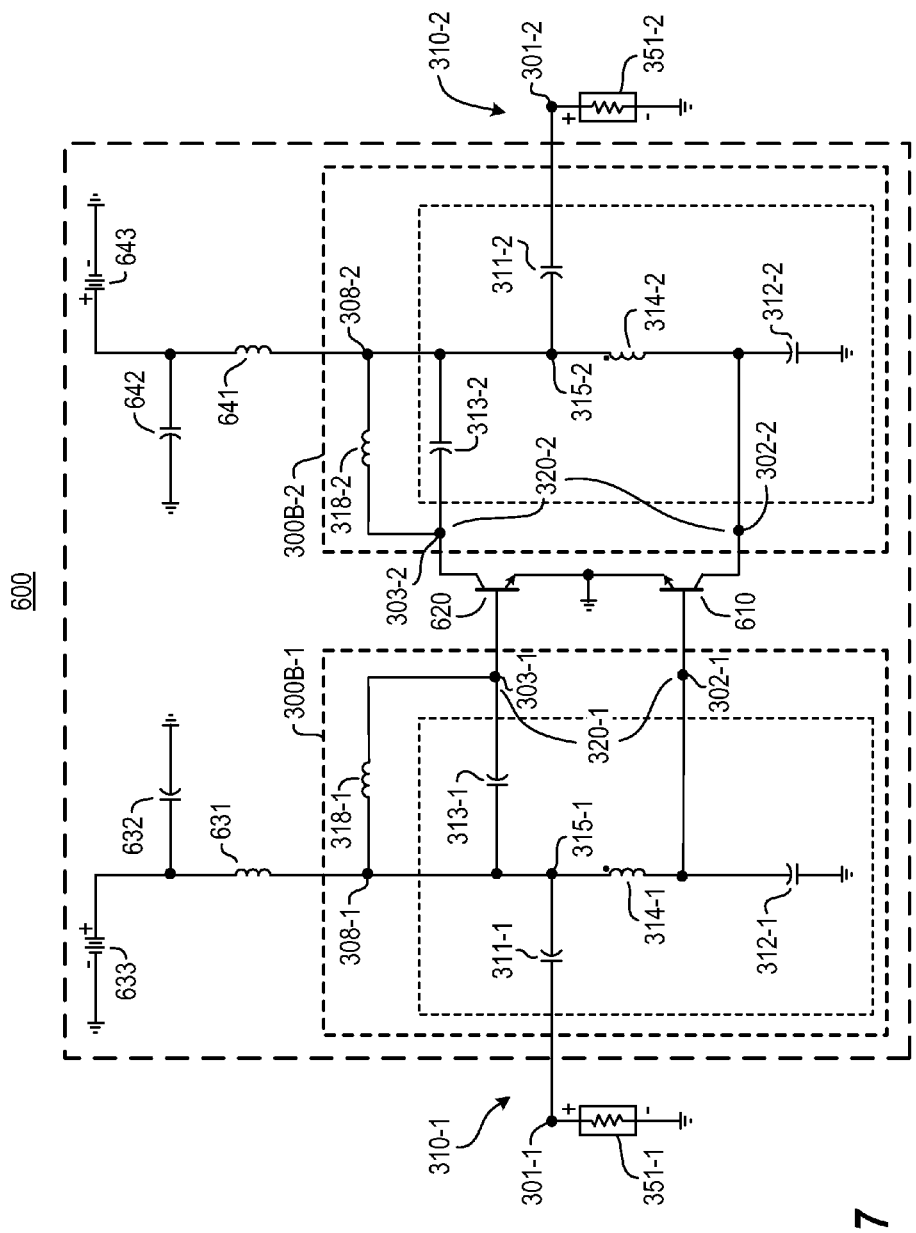
FIG. 7 is a simplified circuit diagram illustrating a push-pull amplifier including multiple baluns, according to a representative embodiment.

FIG. 7 is a simplified circuit diagram illustrating a push-pull amplifier including multiple baluns, according to a representative embodiment. As mentioned above, such an application requires DC supply capability, so each of the multiple baluns in the depicted example is a balun 300B configured for a DC feed.

Referring to FIG. 7, push-pull amplifier 600 includes first and second baluns 300B-1 and 300B-2, each of which is configured as discussed above with reference to FIG. 3B. That is, the first balun 300B-1 includes first capacitor 311-1 connected between single-ended terminal 301-1 of unbalanced port 310-1 and internal node 315-1, which is located between inductor 314-1 and third capacitor 313-1. The inductor 314-1 is connected between the internal node 315-1 and first differential node 302-1 of balanced port 320-1. Second capacitor 312-1 is connected between the first differential node 302-1 and ground. The third capacitor 313-1 is connected between the internal node 315-1 and second differential node 303-1 of the balanced port 320-1. Bypass inductor 318-1 is connected in parallel with the third capacitor 313-1 between the internal node 315-1 and the second differential node 303-1. Similarly, the second balun 300B-2 includes first capacitor 311-2 connected between single-ended terminal 301-2 of unbalanced port 310-2 and internal node 315-2, which is located between inductor 314-2 and third capacitor 313-2. The inductor 314-2 is connected between the internal node 315-2 and first differential node 302-2 of the balanced port 320-2. Second capacitor 312-2 is connected between the first differential node 302-2 and ground. The third capacitor 313-2 is connected between the internal node 315-2 and second differential node 303-2 of the balanced port 320-2. Bypass inductor 318-2 is connected in parallel with the third capacitor 313-2 between the internal node 315-2 and the second differential node 303-2.

The push-pull amplifier 600 further includes first and second transistors 610 and 620 connected to the balanced ports 320-1 and 320-2 of the first and second baluns 300B-1 and 300B-2. For example, the first transistor 610 is depicted as a bipolar junction transistor (BJT) with a base connected to the first differential node 302-1, a collector connected to the first differential node 302-2 and an emitter connected to ground, and the second transistor 620 is depicted as a BJT with a base connected to the second differential node 303-1 (and thus connected to the bypass inductor 318-1), a collector connected to the second differential node 303-2 (and thus connected to the bypass inductor 318-2) and an emitter connected to ground. Although depicted as NPN-type BJTs, it is understood that the first and second transistors 610 and 620 may be implemented as other types of transistors, such as PNP-type BJTs or various types of field effect transistors (FETs), without departing from the scope of the present teachings.

A first DC feed is provided to the first balun 300B-1 by DC voltage source 633, which is connected to DC feed contact 308-1 of the first balun 300B-1 via first feed inductor 631. First blocking capacitor 632 is connected between the first feed inductor 631 and ground. Additional capacitors (not shown) may be included in parallel with the first blocking capacitor 632 to improve suppression of unwanted oscillations coming from the DC path. Likewise, a second DC feed is provided to the second balun 300B-2 by DC voltage source 643, which is connected to DC feed contact 308-2 of the second balun 300B-2 via second feed inductor 641. Second blocking capacitor 642 is connected between the second feed inductor 641 and ground. Additional capacitors (not shown) may be included in parallel with the second blocking capacitor 642 to improve suppression of unwanted oscillations coming from the DC path. Thus, the push-pull amplifier 600 exemplifies a configuration in which the application of baluns requires DC feed capability.

Throughout the disclosure, the frequency of the signals and/or the real/complex port impedances, and thus the respective values of the LC components, may vary to provide unique benefits for any particular situation or to meet application specific design requirements of various implementations.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A balun, comprising:
an unbalanced port configured to apply a single-ended signal;
a first capacitor connected between the unbalanced port and an internal node;
an inductor connected between the internal node and a first differential terminal of a balanced port;
a second capacitor connected as a shunt element between the first differential terminal and ground; and
a third capacitor connected between the internal node and a second differential terminal of the balanced port, wherein no shunt element is connected to the second differential terminal.

2. The balun of claim 1, wherein the single-ended signal comprises a radio frequency (RF) signal provided by an unbalanced port of an RF circuit comprising at least one of a die, a lid and a substrate.

3. The balun of claim 2, wherein the RF circuit comprises at least one filter die comprising a plurality of acoustic resonators, or an antenna circuit.

4. The balun of claim 2, wherein at least one of the first capacitor, the second capacitor, the third capacitor and the inductor is implemented in or on the at least one of the die, the lid and the substrate of the RF circuit.

5. The balun of claim 1, wherein the inductor and the third capacitor form a first resonant series LC circuit, which provides the balanced port, and
the first capacitor, the inductor and the second capacitor form a second resonant series LC circuit, which provides the unbalanced port.

6. The balun of claim 1, wherein:
a third capacitance value C3 of the third capacitor is substantially determined as follows:

$$C3 = \sqrt{\frac{1}{2\omega^2 \times Ra \times Rb}}$$

a second capacitance value C2 of the second capacitor is substantially equal to two times the third capacitance value C3, a first capacitance value C1 of the first capacitor is substantially equal to the second capacitance value C2, and an inductance value L1 of the inductor is substantially determined as follows:

$$L1 = \frac{1}{\omega^2 \times C3}$$

where f is target design frequency of the balun, which is dependent on operation frequency of an application, ω is equal to 2πf, Ra is a reference impedance of the unbalanced port with respect to ground and Rb is a reference impedance of each of the first and second differential terminals of the balanced port, each of the first and second differential terminals being referenced to ground.

7. The balun of claim 1, wherein the first capacitor acts as a DC block.

8. The balun of claim 1, further comprising:
a bypass inductor connected in parallel with the third capacitor between the internal node and the second differential terminal, the bypass inductor enabling DC feeding via a DC feed contact.

9. A push-pull amplifier circuit comprising:
at least one balun of claim 8;
a first transistor connected to the first differential terminal of the balanced port of the at least one balun;
a second transistor connected to the second differential terminal of the balanced port of the at least one balun;
a feed inductor connected in series between an DC voltage source and the DC feed contact of the at least one balun; and
at least one blocking capacitor connected between the feed inductor and ground.

10. A balun, comprising:
an unbalanced port configured to apply a single-ended signal;
a first inductor connected between the unbalanced port and an internal node;
a capacitor connected between the internal node and a first differential terminal of a balanced port;
a second inductor connected as a shunt element between the first differential terminal and ground; and
a third inductor connected between the internal node and a second differential terminal of the balanced port, wherein no shunt element is connected to the second differential terminal.

11. The balun of claim 10, wherein the single-ended signal comprises a radio frequency (RF) signal provided by an unbalanced port of an RF circuit comprising at least one of a die, a lid and a substrate.

12. The balun of claim 11, wherein the RF circuit comprises at least one filter die comprising a plurality of acoustic resonators.

13. The balun of claim 11, wherein at least one of the first inductor, the second inductor, the third inductor and the capacitor is implemented in or on the at least one of the die, the lid and the substrate of the RF circuit.

14. The balun of claim 10, wherein the capacitor and the third inductor form a first resonant series LC circuit, which provides the balanced port, and
the first inductor, the capacitor and the second inductor form a second resonant series LC circuit, which provides the single-ended port.

15. The balun of claim 10, wherein:
a third inductance value L3 of the third inductor is substantially determined as follows:

$$L3 = \sqrt{\frac{2 \times Ra \times Rb}{\omega^2}},$$

a capacitance value C1 of the capacitor is substantially determined as follows:

$$C1 = \frac{1}{\omega^2 \times L3},$$

a second inductance value L2 of the second inductor is substantially determined as follows:

$$L2 = \frac{1}{2\omega^2 \times C1},$$

and
a first inductance value L1 of the first inductor is substantially equal to the second inductance value L2, where f is target design frequency of the balun, which is dependent on operation frequency of an application, ω is equal to 2πf, Ra is a reference impedance of the unbalanced port with respect to ground and Rb is a reference impedance of each of the first and second differential terminals of the balanced port, where each of the first and second differential terminals is referenced to ground.

16. The balun of claim 10, further comprising:
a bypass inductor connected in parallel with the capacitor between the internal node and the first differential terminal, the bypass inductor enabling DC feeding via a DC feed contact.

17. A push-pull amplifier circuit comprising:
at least one balun of claim 16;
a first transistor connected to the first differential terminal of the balanced port of the at least one balun;
a second transistor connected to the second differential terminal of the balanced port of the at least one balun;
a feed inductor connected in series between an DC voltage source and the DC feed contact of the at least one balun; and
at least one blocking capacitor connected between the feed inductor and ground.

18. A four LC element balun, comprising:
an unbalanced port comprising a single-ended terminal referenced to ground and configured to apply a singled-ended signal;
a balanced port comprising first and second differential terminals configured to apply a differential signal;

a first series resonant LC circuit connected between the first and second differential terminals, the first series resonant LC circuit comprising a first element of a first type and one element of a second type connected in series; and a second series resonant LC circuit connected between the single-ended terminal and ground, the second series resonant LC circuit comprising second and third elements of the first type and the one element of the second type connected in series, the second element of the first type being connected between the single-ended terminal and the one element of the second type, and the third element of the first type being connected between the one element of the second type and ground, wherein the one element of the second type is shared by the first and second series resonant LC circuits, and wherein the first differential terminal is connected between the one element of the second type and the third element of the first type, the third element of the first type being connected as a shunt element to the first differential terminal and no element of the first type or of the second type being connected as a shunt element to the second differential terminal.

19. The balun of claim 18, wherein the first type of element is a capacitor and the second type of element is an inductor.

20. The balun of claim 18, wherein the first type of element is an inductor and the second type of element is a capacitor.

21. A balun, comprising:

an unbalanced port configured to apply a single-ended signal, the unbalanced port comprising a single-ended terminal having a first complex port impedance;

a first susceptance element connected between the unbalanced port and an internal node, the first susceptance element comprising a physically realizable LC element;

a reactance element connected between the internal node and a first differential terminal of a balanced port, the balanced port comprising differential terminals each having a second complex port impedance;

a second susceptance element connected between the first differential terminal and ground; and a third susceptance element connected between the internal node and a second differential terminal of the balanced port, wherein no shunt susceptance or shunt reactance element is connected to the second differential terminal.

22. The balun of claim 21, wherein a third susceptance value B3 is substantially determined as follows:

$$B_3 = +\sqrt{\frac{\operatorname{Re}\{Yb\}}{2 \times \operatorname{Re}\{Za\}}}$$

a reactance value X0 is substantially equal to the reciprocal of the third susceptance value B3, a second susceptance value B2 is substantially equal to twice the third susceptance value B3 and a first susceptance value B1 is substantially equal to a negative of the reciprocal of a first reactance value X1, where the first reactance value X1 is substantially determined as follows:

$$X1 = -\frac{1}{B2} - \frac{\operatorname{Im}\{Yb\}}{B2 \times B3} - \operatorname{Im}\{Za\}$$

where Za is a reference impedance of the unbalanced port with respect to ground, Zb is a reference impedance of each of the first and second differential terminals of the balanced port, each of the first and second differential terminals being referenced to ground, Yb is equal to the reciprocal of Zb, and where Re refers to real part and Im refers to imaginary part.

23. The balun of claim 21, wherein a third susceptance value B3 is substantially determined as follows:

$$B_3 = -\sqrt{\frac{\operatorname{Re}\{Yb\}}{2 \times \operatorname{Re}\{Za\}}}$$

a reactance value X0 is substantially equal to the reciprocal of the third susceptance value B3, a second susceptance value B2 is substantially equal to twice the third susceptance value B3 and a first susceptance value B1 is substantially equal to a negative of the reciprocal of a first reactance value X1, where the first reactance value X1 is substantially determined as follows:

$$X1 = -\frac{1}{B2} - \frac{\operatorname{Im}\{Yb\}}{B2 \times B3} - \operatorname{Im}\{Za\}$$

where Za is a reference impedance of the unbalanced port with respect to ground, Zb is a reference impedance of each of the first and second differential terminals of the balanced port, each of the first and second differential terminals being referenced to ground, Yb is equal to the reciprocal of Zb, and where Re refers to a real part and Im refers to an imaginary part.

* * * * *